(12) United States Patent
Snyder

(10) Patent No.: US 11,587,798 B2
(45) Date of Patent: Feb. 21, 2023

(54) HIGH HEAT FLUX POWER ELECTRONICS COOLING DESIGN

(71) Applicant: Rolls-Royce North American Technologies Inc., Indianapolis, IN (US)

(72) Inventor: Douglas J. Snyder, Carmel, IN (US)

(73) Assignee: ROLLS-ROYCE NORTH AMERICAN TECHNOLOGIES INC., Indianapolis, IN (US)

( * ) Notice: Subject to any disclaimer, the term of this patent is extended or adjusted under 35 U.S.C. 154(b) by 373 days.

(21) Appl. No.: 16/733,424

(22) Filed: Jan. 3, 2020

(65) Prior Publication Data

US 2021/0210361 A1 Jul. 8, 2021

(51) Int. Cl.
| | |
|---|---|
| *H01L 21/48* | (2006.01) |
| *H01L 23/473* | (2006.01) |
| *H01L 23/367* | (2006.01) |
| *B23P 15/26* | (2006.01) |
| *B23K 20/02* | (2006.01) |

(52) U.S. Cl.
CPC .......... *H01L 21/4882* (2013.01); *B23K 20/02* (2013.01); *B23P 15/26* (2013.01); *H01L 23/3672* (2013.01); *H01L 23/473* (2013.01); *Y10T 29/49366* (2015.01); *Y10T 29/49393* (2015.01)

(58) Field of Classification Search
CPC ... B23K 2101/14; B23K 1/0012; B23P 15/26; B23P 2700/10; Y10T 29/49366; Y10T 29/49393; H01L 21/4882; H01L 21/4871; H01L 21/4878; H01L 23/46; H01L 23/473; F28D 1/0246; F28D 1/03; F28D 1/0308; F28D 1/0316; F28D 1/0325; F28D 1/0535
See application file for complete search history.

(56) References Cited

U.S. PATENT DOCUMENTS

| | | | | |
|---|---|---|---|---|
| 5,193,611 | A * | 3/1993 | Hesselgreaves | F28F 3/02 29/890.039 |
| 5,381,859 | A * | 1/1995 | Minakami | F28D 15/0275 174/16.3 |
| 6,695,044 | B1 * | 2/2004 | Symonds | F28D 9/0075 165/166 |
| 6,968,892 | B1 * | 11/2005 | Symonds | F28D 9/0075 165/165 |
| 8,056,615 | B2 * | 11/2011 | Downing | F28D 15/0233 165/80.4 |
| 8,541,875 | B2 | 9/2013 | Bennion et al. | |
| 9,383,143 | B2 * | 7/2016 | Fryer | F28F 21/084 |
| 2002/0144809 | A1 * | 10/2002 | Siu | B21D 53/04 165/185 |
| 2010/0326632 | A1 * | 12/2010 | Nagai | H01L 23/427 165/104.21 |
| 2012/0181005 | A1 * | 7/2012 | Downing | F28F 3/086 165/170 |
| 2016/0033209 | A1 * | 2/2016 | Campbell | H01S 5/02423 29/890.039 |

* cited by examiner

*Primary Examiner* — Jason L Vaughan
(74) *Attorney, Agent, or Firm* — Crowell & Moring LLP

(57) ABSTRACT

A base plate for cooling a power electronics device is provided, the base plate comprising cooling fins, the base plate configured to receive the power electronics device directly above the cooling fins, the cooling fins integral to the base plate, the base plate configured to conduct a liquid coolant past the cooling fins.

2 Claims, 3 Drawing Sheets

Section A-A

HIGH HEAT FLUX POWER ELECTRONICS COOLING DESIGN

TECHNICAL FIELD

This disclosure relates to power electronics and, in particular, to a base plate for cooling power electronics.

BACKGROUND

Present base plates on which power electronics may be mounted suffer from a variety of drawbacks, limitations, and disadvantages. Accordingly, there is a need for inventive systems, methods, components, and apparatuses described herein.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1B:
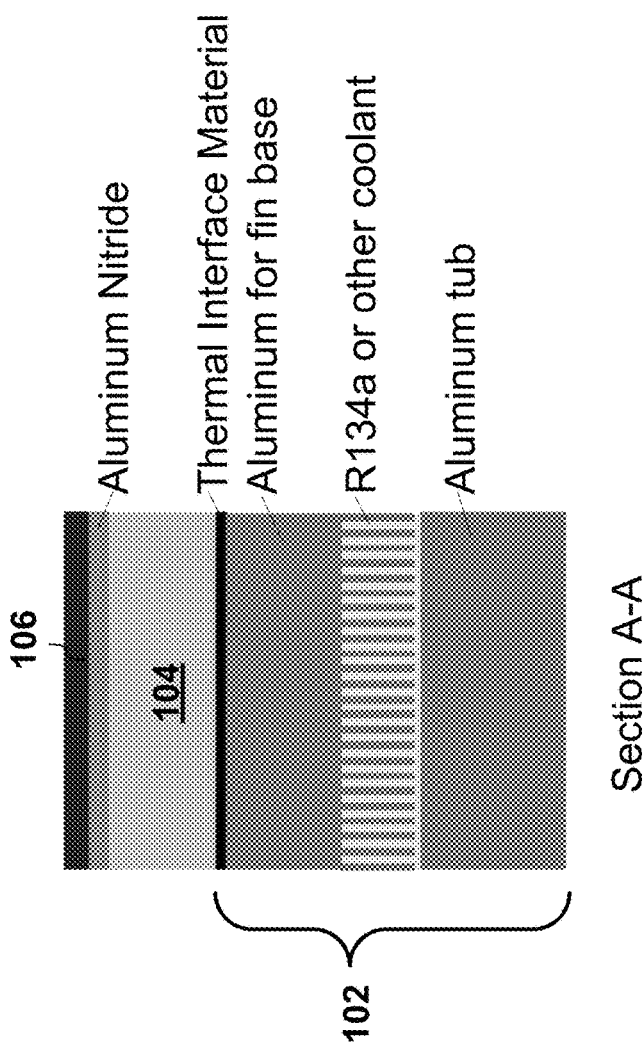
FIG. 1B is a cross-sectional view of section A-A identified in FIG. 1A.

Hybrid electric propulsion makes use of power electronics devices in, for example, converters and inverters. The power electronics devices include semiconductor devices, such as MOSFETS or any other solid state electronics, to modify electrical power signals. Such small devices may, in some examples, have a surface area to cool that is less than 1 cm$^2$, and yet have a heat flux that is 100's to even 1000's of Watts/cm$^2$. These power electronics devices may also be used in directed energy systems, or any other system requiring power. The power electronic devices may include, for example, an AC/DC converter, a DC/AC converter, a rectifier, or any other semiconductor device.

The power electronic devices are considered heat loads. In some examples, the heat load was spread with a cold plate, which increases the surface area in order to accommodate relatively low heat transfer coefficients. However, the cold plate and other cooling hardware extending between the die and coolant, can introduce significant thermal resistance between the active heat producing die of the power electronic device and the coolant which flows through the hardware. This additional thermal resistance may force coolant temperature to be quite low in some examples. For example, the heat producing die may operate at temperatures between 150 to 200 degrees Celsius ("C"), but due to thermal resistance of the cooling hardware, the system may require coolant temperatures of 40 to 70 degrees C. in order to draw the heat away from the die fast enough to keep the die from overheating.

This poses a significant challenge to hybrid electric flight systems. On a 1% Hot Day, ambient air temperatures at sea level may reach 49 degrees C. (120 F), and therefore cooling is very difficult due to the very small temperature difference between the heat sink (typically ram air) and the coolant used to cool the power electronics (e.g. water based coolants). For example, if the coolant were 60 degrees C. after exiting the cooling hardware, then the temperature difference between the coolant and the ambient air would be 60 minus 49, or 11 degrees C. This very small temperature difference requires extremely high air flow rates because W=Q/(Cp*dT). This large air flow rate results in large drag forces on the aircraft and large air ducts and large heat exchangers that result in additional mass to the air vehicle system.

Recent advances in cooling with two phase coolants greatly increase the peak heat flux that can be cooled. This eliminates or reduces the need to spread the heat with the cold plate. This enables bringing the two phase coolant directly under the high heat flux die. This significantly reduces the thermal resistance between the die and the coolant. As a result, the power electronics coolant may now operate at temperatures at or above, for example, 100 degrees C. This significantly increases the temperature difference (dT) between an air heat sink and the coolant immediately after the coolant passes the high heat flux die. As a result, such an arrangement enables a reduced air side flow rate requirement. Alternatively or in addition, such an arrangement enables increased efficiency of a thermal lift system if used.

Power electronics manufacturers have not sufficiently modified their designs to support bringing the coolant closer to the active die. The innovative systems described herein (also referred to as a base plate design) have similar dimensions to a traditional base plate that electrical die are bonded to. Such a system may reduce the size/weight of the power electronics system by eliminating the need for a discrete conventional cold plate to which cooling fins are attached. Further, this design approach may enable more rapid acceptance of cooling that is integrated with a power module.

In one example, a method of manufacturing a base plate for a semiconductor is provided. The method comprises: forming a plurality of pieces of the base plate from a metal sheet by etching openings in the metal sheet, wherein after etching, a first set of the pieces comprises a plurality of cooling fins and a second set of the pieces comprises passages; stacking the pieces such that each of the pieces comprising the cooling fins is adjacent to a corresponding one of the pieces comprising the passages; and bonding the stacked pieces together to form the base plate or a portion thereof, the cooling fins and the passages between the cooling fins being integral to, and included within, the base plate.

In a second example, a method of manufacturing a base plate for a semiconductor is provided. The method comprises: forming a plurality of pieces of the base plate from a metal sheet by etching openings in the metal sheet, wherein after etching, a first set of the pieces comprises a plurality of cooling fins; etching a portion of each of the cooling fins to form a corresponding passage adjacent to the respective one of the cooling fins; stacking the pieces; and bonding the stacked pieces together to form the base plate or a portion thereof, the cooling fins and the passages between the cooling fins being integral to, and included within, the base plate.

In a third example, a base plate for cooling a power electronics device is provided. The base plate includes cooling fins, the base plate configured to receive the power electronics device directly above the cooling fins, the cooling fins integral to the base plate, the base plate configured to conduct a liquid coolant past the cooling fins.

Figure 1A:
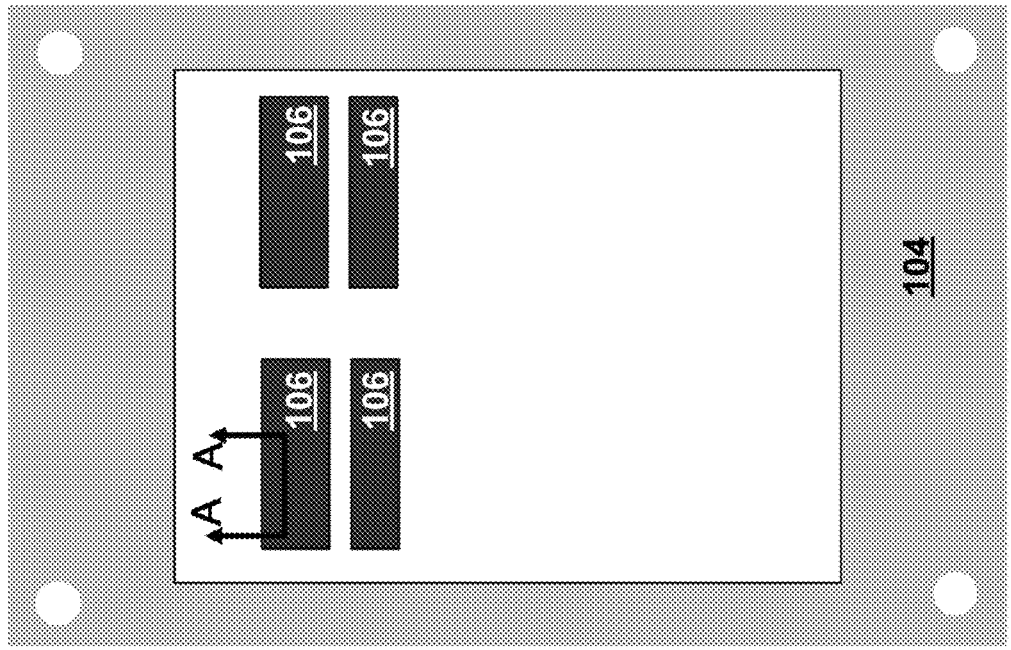
FIG. 1A is a top view of a base plate on which power electronics devices are mounted.

FIGS. 1A and 1B illustrate an example of a conventional design for cooling hardware 102 mounted on a base plate 104. FIG. 1A is a top view of the base plate 104 on which power electronics devices 106 are mounted. FIG. 1B is a cross-sectional view of section A-A identified in FIG. 1A. An aluminum nitride or aluminum oxide layer is positioned between a die of the power electronics devices 106 (heat source) and the base plate 104. The base plate 104 is made of copper. The cooling hardware 102 in the illustrated example includes a thermal interface material and an aluminum based cold plate. The cold plate includes a fin base and fins, and is positioned in a tub, all of which are made of aluminum in the illustrated example. During cooling of the power electronics devices 106, coolant R134a (or other type of coolant) flows past the fins as the coolant flows along the cold plate. The fins in the aluminum cold plate are sufficiently short so that the fins can fit within the aluminum tub recess. Manufacturing processes limit the aspect ratio of the fin height to fin thickness.

Figure 2B:
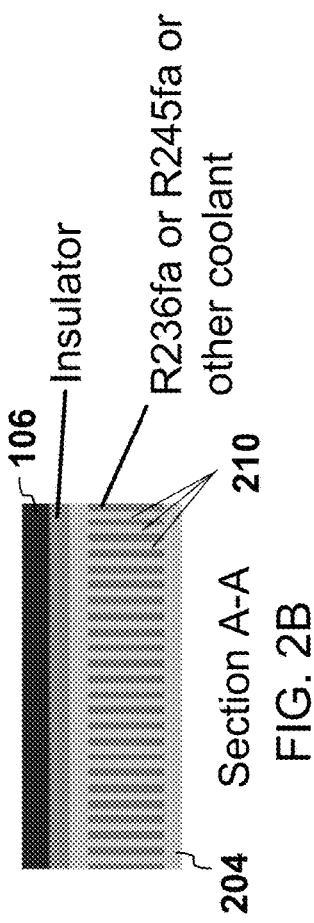
FIG. 2B is a cross-sectional view of section A-A identified in FIG. 2A.
Figure 2C:
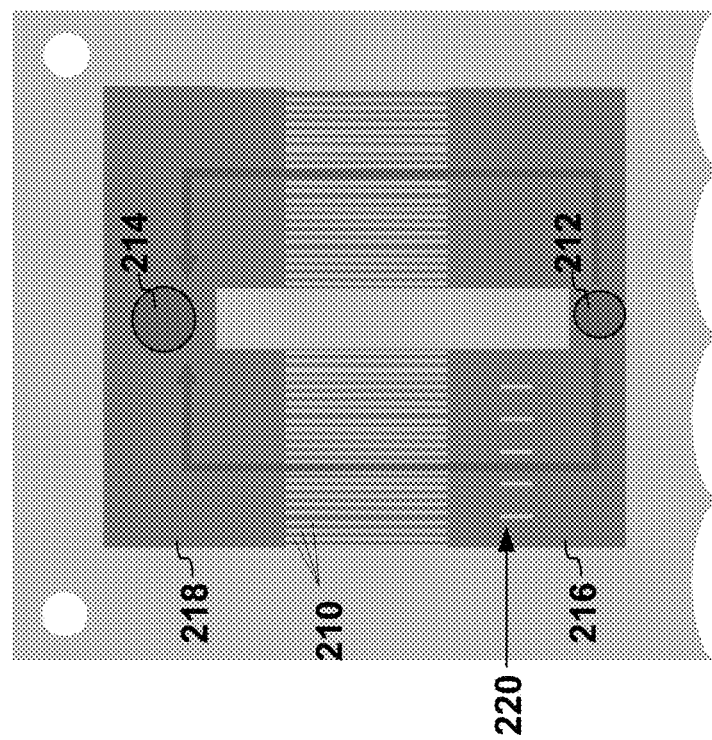
FIG. 2C is a cross-sectional view made in a plane that is parallel to the top of the base plate shown in FIG. 2A.
Figure 2A:
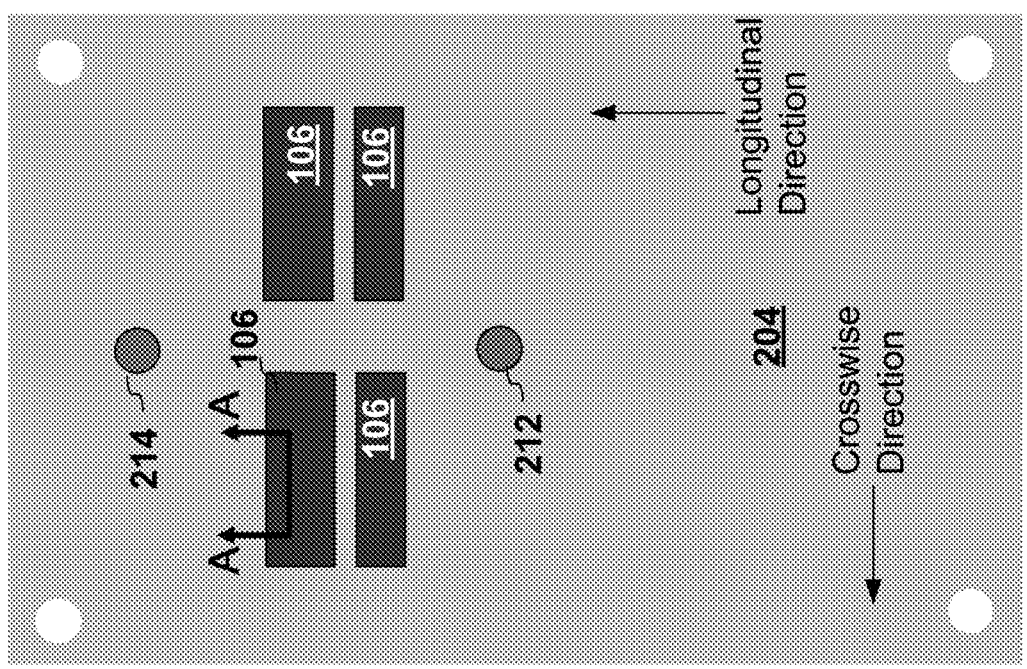
FIG. 2A is a top view of a base plate, which comprises cooling fins, on which power electronics devices are mounted.

FIGS. 2A-C illustrate an example of a base plate 204 comprising cooling fins 210 (only a subset of the cooling fins 210 are identified by lead lines in order to avoid cluttering FIGS. 2B-C). The cooling fins 210 are integral to, and included within, the base plate 204 itself. As a result, the base plate 204 shown in FIGS. 2A-C does not necessarily require the cooling hardware 102 shown in FIG. 1 that the conventional base plate 104 requires. FIG. 2A is a top view of the base plate 204 on which power electronics devices 106 are mounted. FIG. 2B is a cross-sectional view of section A-A identified in FIG. 2A. The cross-section of the base plate 204 shown in FIG. 2B is made in a plane that is perpendicular to the top of the base plate 204 and extends in the crosswise direction. In the illustrated example, the cooling fins 210 extend in the longitudinal direction. FIG. 2C is a cross-sectional view of the base plate 204 made in a plane that is parallel to the top of the base plate 204. The base plate 204 comprises copper or any other thermally conductive material, metal, and/or metal alloy.

To maintain a high Critical Heat Flux (CHF) capability, the cooling fins 210 may be located only directly under the high heat flux die of the power electronics devices 106. Alternatively, the cooling fins 210 may be located partially under the die of the power electronics devices 106 or adjacent the die of the power electronics. Each of the cooling fins 210 shown arranged in FIG. 2C extend directly under two corresponding ones of the power electronics devices 106. In particular, the cooling fins 210 shown on a left-hand side extend under a first two of the power electronics devices 106, and the cooling fins 210 shown on a right-hand side extend under a second two of the power electronics. An electrical insulator comprising Aluminum Nitride, Aluminum Oxide, or any other material that is thermally conductive and functions as an electrical insulator may be located between the power electronics devices 106 and the base plate 204.

During cooling of the power electronics devices 106, coolant flows through an inlet 212 into a chamber 216. From the chamber 216, the coolant flows past the cooling fins 210. The heat from the die of the power electronics devices 106, which are located directly above the cooling fins 210, flows into the cooling fins 210. As the coolant flows past the cooling fins 210, the heat is transferred from the cooling fins 210 to the coolant. The coolant then flows into a chamber 218 before exiting through an outlet 214.

The fluid in the base plate 204 may be at significantly higher pressures than ambient conditions. In some examples, webs 220 may be included in one or more of the chambers 216 and 218 in order to limit ballooning of the base plate 204 cause by such pressure differences. In some configurations, this ballooning may lead to early failure of the die bond.

Coolant may be brought into the base plate 204 by brazing a coolant line (not shown) to the base plate 204 at the inlet 212 if doing so does not interfere with the fabrication process. Alternatively, the base plate 204 may be bolted to a coolant feed system (not shown) and an o-ring (not shown) may be used to seal the coolant feed line to the base plate 204 that supplies coolant. Similarly a coolant line (not shown) may be coupled to the outlet 214. The base plate 204 may include any number of inlets and outlets.

In some examples, the coolant may be a two-phase coolant. Examples of the two-phase coolant may include R245fa, R236fa, Novec fluids, or any other higher temperature fluids that have phase change. Alternatively, the coolant may be a single-phase coolant, such as deionized water.

The base plate 204 may have any shape, not just a rectangular shape as shown in FIG. 2A. The cooling fins 210 may be extend in any direction. Although the cooling fins 210 illustrated are perpendicular to the top of the base plate 204, the cooling fins 210 may be at a different angle to the top of the base plate 204.

Generally speaking, microchannel cooling fins may be produced through a skiving process. The skiving process may limit the aspect ratio of the channels. The cooling fins 210 shown in FIGS. 2B and C may be manufactured using, for example, an etch and diffusion bond manufacturing process that can produce extremely small etch passages.

Figure 3:
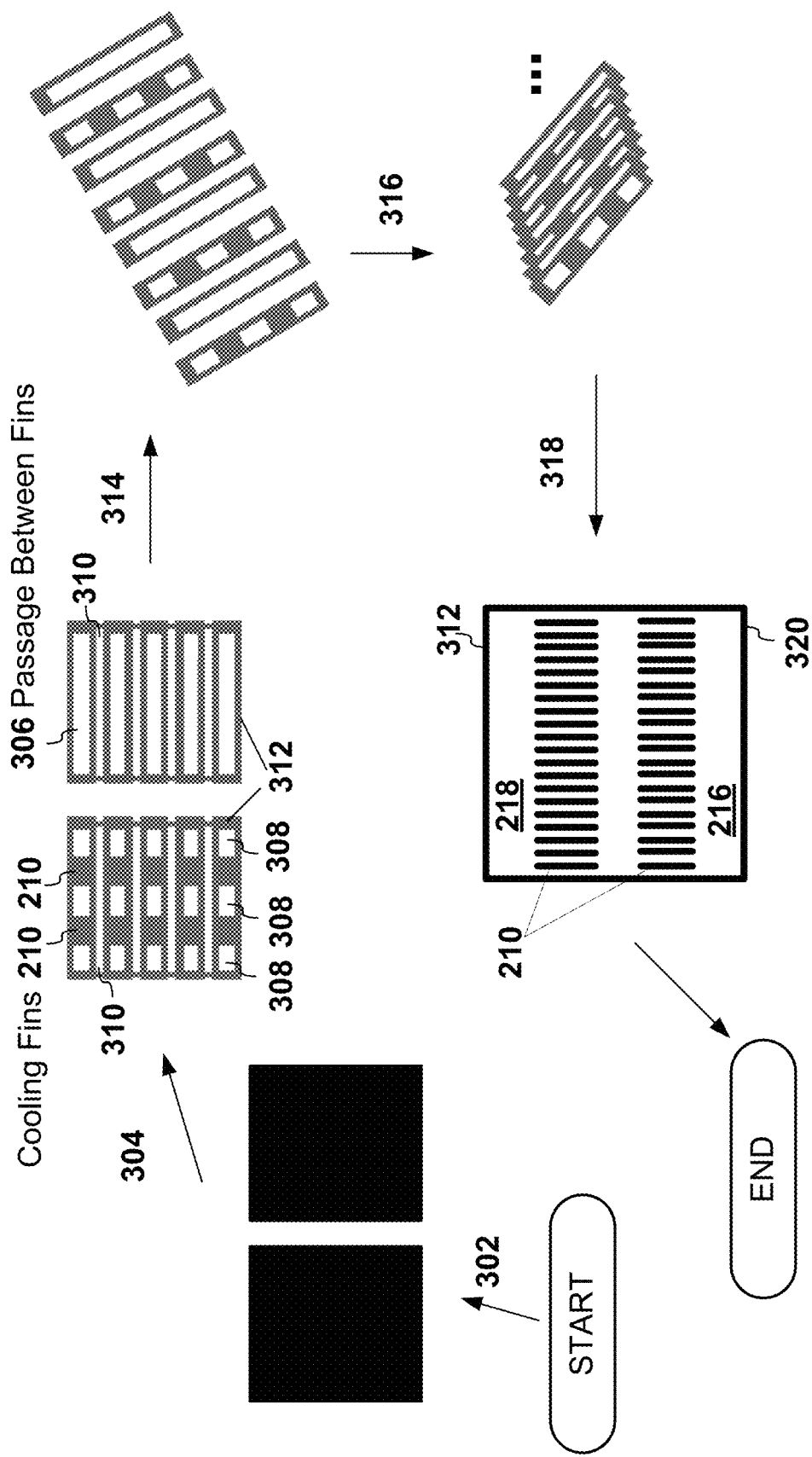
FIG. 3 illustrates an example of a method of manufacturing a base plate shown in FIGS. 2A-C.

FIG. 3 illustrates an example of a method of manufacturing the base plate 204 shown in FIGS. 2A-C. Operations may begin by providing (302) metal sheets. The metal sheets may be copper alloy, for example. The metal sheets may be etched (304) to form corresponding pieces that will be assembled to form the base plate 204 or a portion thereof. Alternatively or in addition, the corresponding pieces may be formed using EDM, laser cutting, water jet, or any other type of process that removes metal from the metal sheets. In the example shown in FIG. 3, a first one of the metal sheets may be etched (304) to create spaces 310 between the pieces of the base plate 204, and to create openings 308 in the metal sheet. The openings 308 may later form part of a chamber, such as the chambers 216 and 218 shown in FIG. 2C. In some examples, tabs connecting the pieces may be left during the etching process (304) so that a group of the pieces may be processed together before the tabs are removed. After etching, the tabs may be removed using, for example, electrical discharge machining (EDM), laser cutting, water jet, or any other type of process that removes metal. Portions of each piece that are between the openings 308 are the cooling fins 210. As explained below, an outer edge 312 of each piece may also ultimately form an outer edge of the base plate 204. The surface 312, where the power electronics device is to be attached will require machining to provide a sufficiently flat and smooth surface for bonding of the electrical device to the base plate. A second one of the metal sheets may be etched (304) to create spaces 310 between the pieces of the base plate 204 and to create a space 306 that will later be a passage between the cooling fins 210 and to create the chamber 216 and 218. The pieces from the first sheet may be referred to as the fin pieces, and the pieces from the second sheet may be referred to as the passage pieces.

Once created and separated, the fin pieces and the passage pieces may be arranged (314) side-by-side so as to alternate between fin piece and passage piece. Next, the pieces may be stacked (316) on top of each other where the pieces alternate between fin piece and passage piece. Alternatively, the pieces may be stacked (316) and arranged in a single step so that the pieces alternate between fin piece and passage piece, thereby eliminating the step of arranging (314) the pieces side-by-side. In some examples, pieces of the metal sheets without openings may be included at the top and bottom of the stack to close off the passage(s) next to the cooling fins 210 that face the top and/or bottom of the stack, and/or to close off the chamber(s) 216 and 218. The stack of pieces may be bonded (318) together. For example, the stack of pieces may be diffusion bonded together, brazed together, or coupled together using any bonding mechanism. The resulting bonded stack 320 of pieces may be the base plate 204 or a portion of the base plate 204. The bonded stack 320 shown in FIG. 3 is a cross-sectional view of the bonded stack 320 similar to the cross-sectional view shown in FIG. 2C. The example shown in FIG. 2C has only one set of the cooling fins 210 on any path from the first chamber 216 to the second chamber 218. In the example shown in FIG. 3, there are two sets of cooling fins 210 on any path from the first chamber 216 to the second chamber 218. However, there may be any number of sets of cooling fins 210 on any path from the first chamber 216 to the second chamber 218.

In some examples, instead of using a separate sheet dedicated to the passages 306 between fins, the passages 306 may be etched from the piece that includes the cooling fins 210. In other words, the cooling fins 210 may have a shallow etch that retains metal for the cooling fins but allows coolant to pass between the cooling fins and an adjacent piece in the stack. This may involve making multiple etch passes in order to only remove a portion of the metal on the sides of the cooling fins 210, but to remove enough material to enable the creation of chambers.

Alternatively or in addition, webs 220 may be retained in select copper sheets where the openings 308 are in order to provide additional support and minimize ballooning of the base plate 204.

The operations illustrated may be performed in an order different than illustrated. The method may include additional, fewer, or different operations than illustrated in FIG. 3. For example, the fin pieces and the passage pieces are formed from separate sheets in the illustrated example. Alternatively or in addition, the fin pieces and the passage pieces may be created from one of the sheets. The illustrated example shows only two sheets, however, the pieces may be formed from one or more sheets.

In the example illustrated in FIG. 3, two sets of the cooling fins 210 are shown. However, one or more sets of the cooling fins 210 may be formed when the pieces are stacked and bonded together.

Each component may include additional, different, or fewer components. The logic illustrated in the flow diagram may include additional, different, or fewer operations than illustrated.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

What is claimed is:

1. A method of manufacturing a base plate for a semiconductor, method comprising:
   forming a plurality of pieces of the base plate from a metal sheet by etching openings in the metal sheet, wherein after etching, the pieces comprise a plurality of cooling fins;
   etching a portion of each of the cooling fins to form a corresponding passage adjacent to the respective one of the cooling fins;
   stacking the pieces; and
   bonding the stacked pieces together to form the base plate or a portion thereof, the cooling fins and the passages between the cooling fins being integral to, and included within, the base plate.

2. The method of claim 1 wherein the bonding is diffusion bonding.

* * * * *